(12) United States Patent
Kim

(10) Patent No.: US 9,728,264 B2
(45) Date of Patent: Aug. 8, 2017

(54) NONVOLATILE MEMORY DEVICE, OPERATING METHOD THEREOF, AND DATA STORAGE DEVICE INCLUDING THE SAME

(71) Applicant: SK hynix Inc., Gyeonggi-do (KR)

(72) Inventor: Tae Hoon Kim, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 74 days.

(21) Appl. No.: 14/789,441

(22) Filed: Jul. 1, 2015

(65) Prior Publication Data

US 2016/0253124 A1 Sep. 1, 2016

(30) Foreign Application Priority Data

Feb. 27, 2015 (KR) .................... 10-2015-0028337

(51) Int. Cl.
*G06F 12/00* (2006.01)
*G11C 16/26* (2006.01)
*G11C 11/56* (2006.01)
*G11C 16/10* (2006.01)

(52) U.S. Cl.
CPC .......... *G11C 16/26* (2013.01); *G11C 11/5628* (2013.01); *G11C 11/5642* (2013.01); *G11C 16/10* (2013.01); *G11C 2211/5641* (2013.01)

(58) Field of Classification Search
CPC .... G06F 3/0679; G06F 3/0611; G06F 3/0625; G06F 3/0659
USPC ................................................. 711/103, 154
See application file for complete search history.

(56) References Cited

U.S. PATENT DOCUMENTS

| | | | | |
|---|---|---|---|---|
| 6,298,421 B1* | 10/2001 | Minamizawa | ............ | G06F 8/65 711/151 |
| 6,725,325 B2* | 4/2004 | Nishiyama | ........... | G11C 7/1006 365/189.07 |
| 8,947,968 B2* | 2/2015 | Chen | ...................... | G11C 5/148 365/203 |
| 9,032,385 B2* | 5/2015 | Kim | ......................... | G06F 8/65 717/171 |
| 2005/0281086 A1* | 12/2005 | Kobayashi | ........ | H01L 21/28282 365/185.23 |
| 2008/0172520 A1* | 7/2008 | Lee | ..................... | G11C 11/5628 711/103 |
| 2015/0127867 A1* | 5/2015 | Takahashi | ............... | G06F 13/24 710/269 |

FOREIGN PATENT DOCUMENTS

KR 100875539 12/2008
KR 100878479 1/2009

* cited by examiner

*Primary Examiner* — Pierre-Michel Bataille
(74) *Attorney, Agent, or Firm* — IP & T Group LLP

(57) ABSTRACT

A nonvolatile memory device includes a memory cell array including a data cell area, and a mode cell area that stores write mode information of the data cell area, a mode information storage block storing previous write mode information read out from the mode cell area in a previous read operation, and a control logic reading out the write mode information from the mode cell area comparing the read-out write mode information and the previous write mode information, and reading the data cell area in a read mode selected based on a comparison result.

19 Claims, 11 Drawing Sheets

NONVOLATILE MEMORY DEVICE, OPERATING METHOD THEREOF, AND DATA STORAGE DEVICE INCLUDING THE SAME

CROSS-REFERENCES TO RELATED APPLICATION

The present application claims priority under 35 U.S.C. §119(a) to Korean application number 10-2015-0028337, filed on Feb. 27, 2015, in the Korean Intellectual Property Office, which is incorporated herein by reference in its entirety.

BACKGROUND

1. Technical Field

Various embodiments generally relate to a semiconductor memory device and, more particularly, to a nonvolatile memory device which performs a read operation in a read mode corresponding to a write mode, an operating method thereof, and a data storage device including the same.

2. Related Art

Semiconductor memory devices are generally divided into volatile and nonvolatile memory devices. While volatile memory devices lose stored data when their power supply is turned off, nonvolatile memory devices retain stored data even without power.

Volatile memory devices include static random access memory (SRAM) using flip-flops, dynamic random access memory (DRAM) using capacitors, and synchronous dynamic random access memory (SDRAM) operating in synchronization with an external device.

Nonvolatile memory devices include NAND flash memory devices, NOR flash memory devices, ferroelectric random access memory (FRAM) using ferroelectric capacitors, magnetoresistive random access memory (MRAM) using tunnel magnetoresistance (TMR) layers, phase change random access memory (PRAM) using chalcogenide alloys, and resistive random access memory (ReRAM) using transition metal oxides.

The paradigm for the computing environment has shifted to ubiquitous computing so that computer systems can be used anytime and anywhere. The use of portable electronic devices such as mobile phones, digital cameras, and notebook computers has rapidly increased. In general, such portable electronic devices use a data storage device that uses a semiconductor memory device. The data storage device is used as a main memory device or an auxiliary memory device of the portable electronic devices.

A data storage device using a semiconductor memory device may provide excellent stability and durability, high information access speed, and low power consumption, since there are no moving parts. Data storage devices having such advantages include universal serial bus (USB) memory devices, memory cards having various interfaces, universal flash storage (UFS) devices, and solid state drives (SSD).

SUMMARY

Various embodiments are directed to a nonvolatile memory device which performs a read operation in a read mode corresponding to a write mode, an operating method thereof, and a data storage device including the same.

In an embodiment, a nonvolatile memory device may include a memory cell array including a data cell area and a mode cell area which stores write mode information of the data cell area, a mode information storage block suitable for storing previous write mode information read out from the mode cell area in a previous read operation, and a control logic suitable for reading out the write mode information from the mode cell area, comparing the read-out write mode information and the previous write mode information, and reading the data cell area in a read mode selected based on a comparison result.

In an embodiment, an operating method of a nonvolatile memory device may include reading out write mode information stored in a mode cell area, determining whether the read-out write mode information and previous write mode information stored in a mode information storage block are the same, and performing a read operation in a read mode selected based on a comparison result.

In an embodiment, a data storage device may include a memory controller suitable for providing a write command, and a nonvolatile memory device including a memory cell array which includes a data cell area and a mode cell area and a mode information storage block, and suitable for selecting a write mode based on the write command provided from the memory controller, storing data in the data cell area in the selected write mode, and storing write mode information on the selected write mode in the mode cell area.

The nonvolatile memory device according to the embodiments may perform a read operation in a read mode corresponding to a write mode without the control of an external device. Due to this fact, the operation speed of a data storage device using the nonvolatile memory device may be improved.

DETAILED DESCRIPTION

Figure 1:
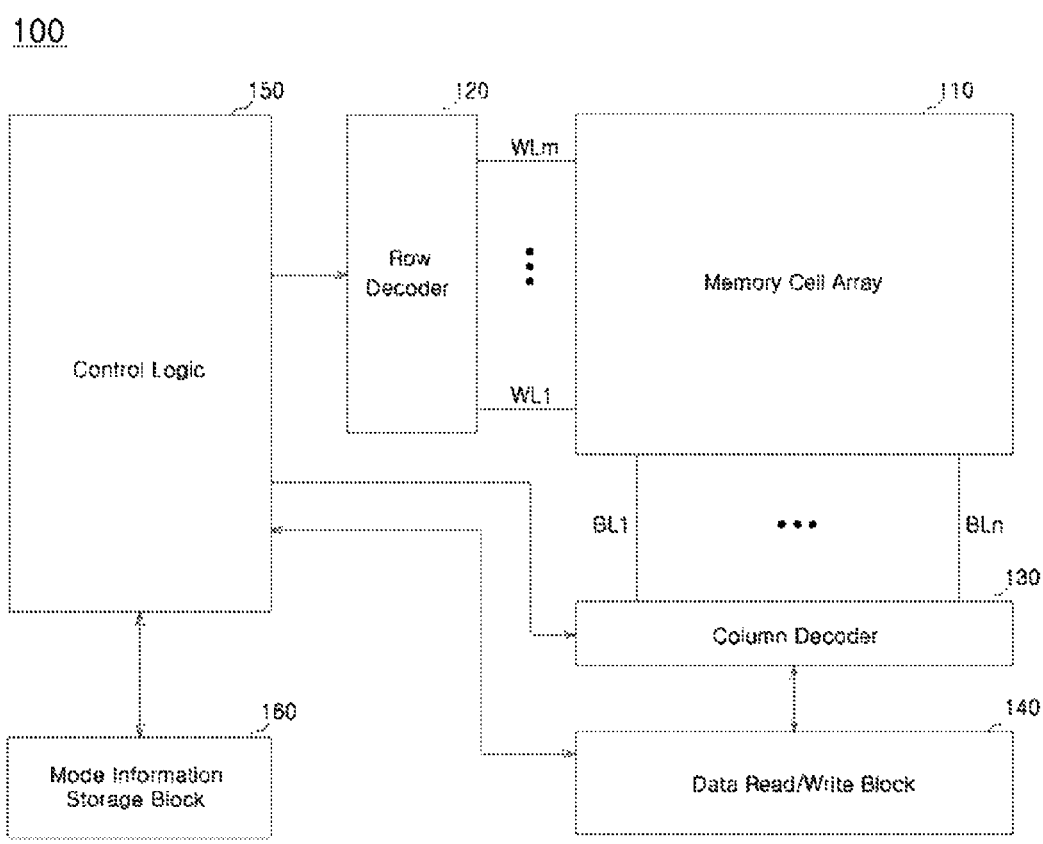
FIG. 1 is a block diagram illustrating an example of a nonvolatile memory device in accordance with an embodiment.

In the present invention, advantages, features and methods for achieving them will become more apparent after a reading of the following exemplary embodiments taken in conjunction with the drawings. The present invention may, however, be embodied in different forms and should not be construed as being limited to the embodiments set forth herein. Rather, these embodiments are provided to describe the present invention in detail to the extent that a person skilled in the art to which the invention pertains can easily enforce the technical concept of the present invention.

It is to be understood herein that embodiments of the present invention are not limited to the particulars shown in the drawings and that the drawings are not necessarily to scale and, in some instances, proportions may have been exaggerated in order to more clearly depict certain features of the invention. While particular terminology is used herein, it is to be appreciated that the terminology used herein is for the purpose of describing particular embodiments only and is not intended to limit the scope of the present invention.

As used herein, the term "and/or" includes any and all combinations of one or more of the associated listed items. It will be understood that when an element is referred to as being "on," "connected to" or "coupled to" another element, it may be directly on, connected or coupled to the other element or intervening elements may be present. As used herein, a singular form is intended to include plural forms as well, unless the context clearly indicates otherwise. It will be further understood that the terms "includes" and/or "including," when used in this specification, specify the presence of at least one stated feature, step, operation, and/or element, but do not preclude the presence or addition of one or more other features, steps, operations, and/or elements thereof.

Hereinafter, a nonvolatile memory device, an operating method thereof, and a data storage device including the same will be described below with reference to the accompanying drawings through various embodiments.

FIG. 1 is a block diagram illustrating a nonvolatile memory device in accordance with an embodiment. Referring to FIG. 1, a nonvolatile memory device 100 may include a memory cell array 110, a row decoder 120, a column decoder 130, a data read/write block 140, a control logic 150, and a mode information storage block 160.

The memory cell array 110 may include memory cells for storing the data provided from an external device (not shown) such as a memory controller. The memory cells may be arranged where word lines WL1 to WLm and bit lines BL1 to BLn cross each other. The memory cells may be grouped into access units such as memory blocks, pages, etc. for conveniently controlling the memory cells.

The row decoder 120 may be coupled with the memory cell array 110 through the word lines WL1 to WLm. The row decoder 120 may operate according to the control of the control logic 150. The row decoder 120 may decode the address provided from the external device. The row decoder 120 may select and drive the word lines WL1 to WLm, based on a decoding result. For instance, the row decoder 120 may provide the word line driving voltage provided from a voltage generator (not shown), to the word lines WL1 to WLm.

The column decoder 130 may be coupled with the memory cell array 110 through the bit lines BL1 to BLn. The column decoder 130 may operate according to the control of the control logic 150. The column decoder 130 may decode the address provided from the external device. The column decoder 130 may couple the bit lines BL1 to BLn with the corresponding read/write circuits of the data read/write block 140, respectively, based on a decoding result. The column decoder 130 may drive the bit lines BL1 to BLn, based on the decoding result.

The data read/write block 140 may operate according to the control of the control logic 150. The data read/write block 140 may operate as a write driver or a sense amplifier according to an operation mode. For example, the data read/write block 140 may operate as a write driver which stores the data provided from the external device, in the memory cell array 110 in a write operation. For another example, the data read/write block 140 may operate as a sense amplifier which reads out data from the memory cell array 110 in a read operation.

The control logic 150 may control the general operations of the nonvolatile memory device 100, based on the control signals provided from the external device. For example, the control logic 150 may control the main operations of the nonvolatile memory device 100 such as read, write and erase operations of the nonvolatile memory device 100.

The control logic 150 may control an internal operation without the control of the external device. For example, the control logic 150 may select a read mode, based on the write mode information stored in the mode information storage block 160 and the write mode information read out from the memory cell array 110, and may perform a read operation in the selected read mode.

The control logic 150 may store the write mode information read out from the memory cell array 110 in the read operation, in the mode information storage block 160. When the write mode information stored in the mode information storage block 160 and the newly read-out write mode information is the same, the control logic 150 may omit the storage of write mode information. Conversely, when the write mode information stored in the mode information storage block 160 and the newly read-out write mode information is different, the control logic 150 may update the mode information storage block 160 with the newly read-out write mode information. That is to say, the write mode information stored in the mode information storage block 160 may be retained until it is updated with new write mode information.

Figure 2:
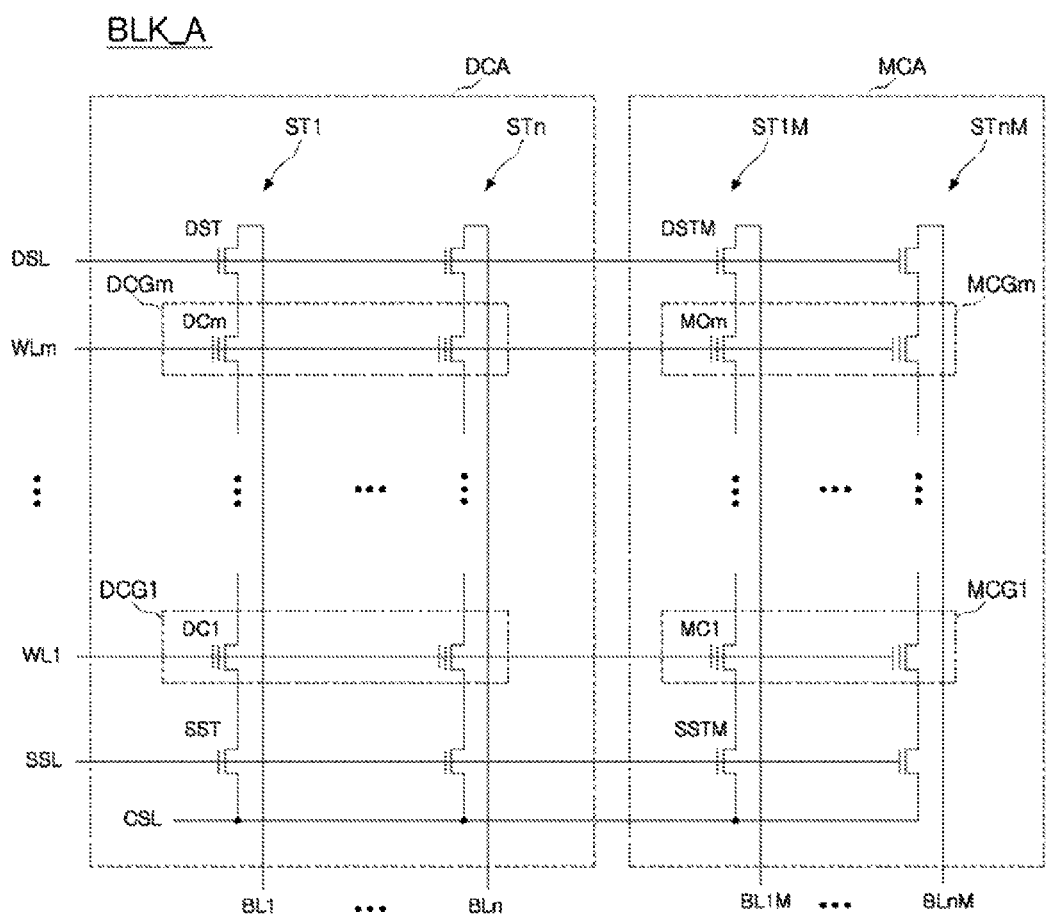
FIGS. 2 and 3 are circuit diagrams illustrating examples of the memory blocks included in the memory cell array shown in FIG. 1.
Figure 3:
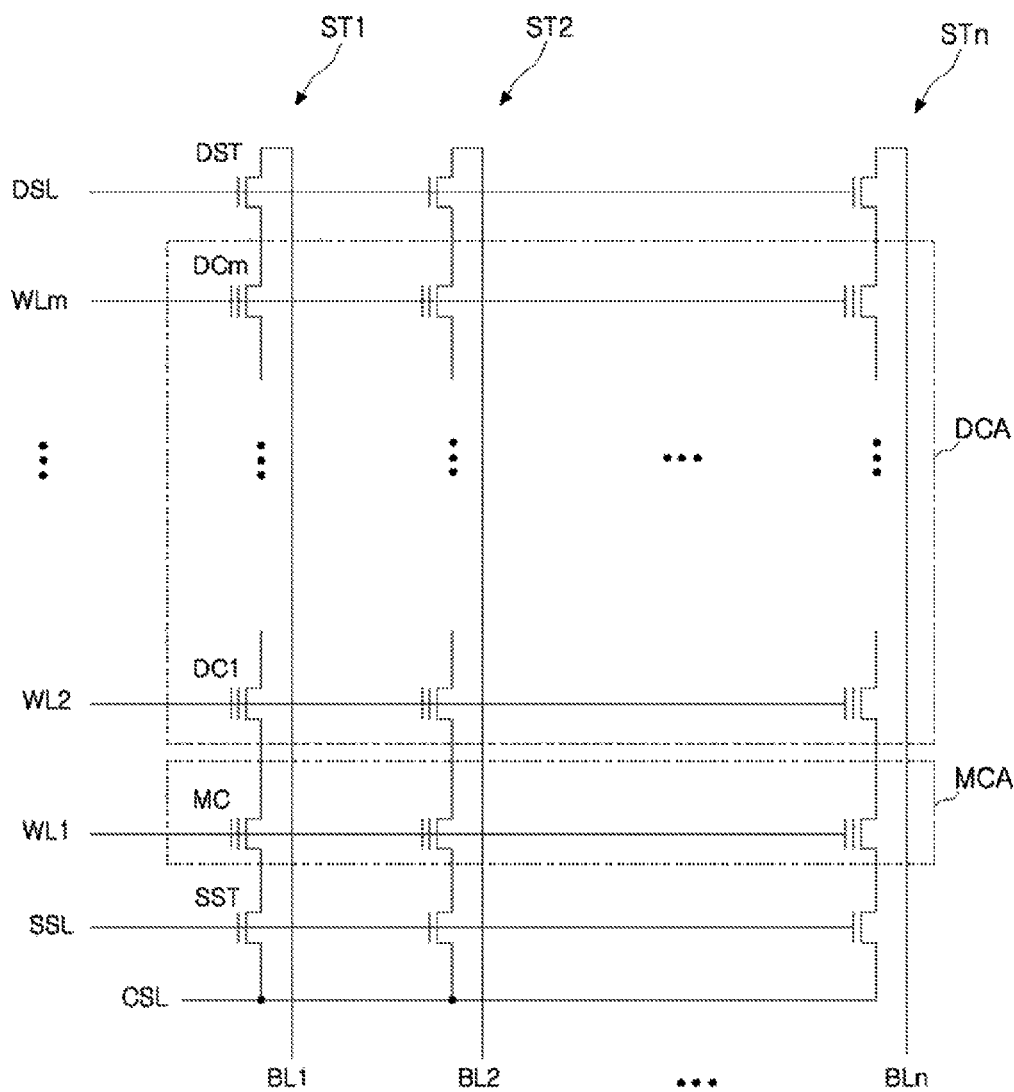

FIGS. 2 and 3 are circuit diagrams illustrating the memory blocks included in the memory cell array 110 shown in FIG. 1. The memory cell array 110 of the nonvolatile memory device 100 shown in FIG. 1 may include a plurality of memory blocks. Each of the plurality of memory blocks may be configured like a memory block BLK_A or BLK_B shown in FIG. 2 or 3.

The memory block BLK_A shown in FIG. 2 as an example may have a first structure in which one mode cell group is allocated to each data cell group constructing one page, that is, a structure in which write mode information may be stored on a per page basis. The memory block BLK_B shown in FIG. 3 as an example may have a second structure in which write mode information may be stored per memory block.

The memory block BLK_A shown in FIG. 2 may include a data cell area DCA and a mode cell area MCA. The data cell area DCA is an area for storing the data provided from the external device. The mode cell area MCA is an area for storing data in write mode where the data cells of the data cell area DCA are written (or programmed) in.

The data cell area DCA may include a plurality of cell strings ST1 to STn which are coupled to the plurality of bit lines BL1 to BLn, wherein n is an integer. The cell strings ST1 to STn have the same circuit configuration, and for a simplified explanation, one cell string ST1 will be representatively described below.

The cell string ST1 may include a plurality of data cells DC1 to DCm and select transistors DST and SST which are coupled between the bit line BL1 and a common source line CSL, wherein m is an integer. For example, the cell string ST1 may include a drain select transistor DST which is coupled to a drain select line DSL, the plurality of data cells DC1 to DCm which are respectively coupled to the plurality of word lines WL1 to WLm, and a source select transistor SST which is coupled to a source select line SSL.

The mode cell area MCA may include a plurality of mode cell strings ST1M to STnM which are coupled to a plurality of mode cell bit lines BL1M to BLnM. The mode cell strings ST1M to STnM have the same circuit configuration, and for a simplified explanation, one mode cell string ST1M will be described below.

The mode cell string ST1M may include a plurality of mode cells MC1 to MCm and select transistors DSTM and SSTM which are coupled between the mode cell bit line BL1M and the common source line CSL. For example, the mode cell string ST1M may include a drain select transistor DSTM which is coupled to the drain select line DSL, the plurality of mode cells MC1 to MCm which are respectively coupled to the plurality of word lines WL1 to WLm, and a source select transistor SSTM which is coupled to the source select line SSL.

The mode cells of the mode cell area MCA may be used as storage elements for storing which write mode the data cells of the corresponding data cell area DCA are written (or programmed) in. Accordingly, the mode cell area MCA is a hidden area that may not be accessed by the user, unlike the data cell area DCA for storing user data.

The control logic 150 may store write mode information for data cell groups DCG1 to DCGm, in corresponding mode cell groups MCG1 to MCGm, respectively. For a simplified explanation, the mode cell area MCA will be described in detail by using the data cell group DCGm constructing one page and the mode cell group MCGm corresponding thereto as an example.

User data may be stored in the data cell group DCGm. The user data and a write command for controlling the storage of the user data may be provided through the external device such as a memory controller which controls the nonvolatile memory device 100. The control logic 150 may store the user data in the data cell group DCGm, based on the write command or based on a write mode information incident to the write command. Also, the control logic 150 may store information on the write mode in which the user data is stored (that is, write mode information), in the mode cell group MCGm corresponding to the data cell group DCGm.

The memory block BLK_B shown in FIG. 3 may include a data cell area DCA and a mode cell area MCA. The data cell area DCA is an area for storing the data provided from the external device. The mode cell area MCA is an area for storing data in write mode where the data cells of the data cell area DCA are written (or programmed) in.

The memory block BLK_B may include a plurality of cell strings ST1 to STn which are coupled to the plurality of bit lines BL1 to BLn. The cell strings ST1 to STn have the same circuit configuration, and for a simplified explanation, one cell string ST1 will be representatively described below.

The cell string ST1 may include a plurality of data cells DC1 to DCm, a mode cell MC and select transistors DST and SST which are coupled between the bit line BL1 and a common source line CSL. For example, the cell string ST1 may include a drain select transistor DST which is coupled to a drain select line DSL, the plurality of data cells DC1 to DCm which are respectively coupled to the plurality of word lines WL2 to WLm, the mode cell MC which is coupled to the word line WL1, and a source select transistor SST which is coupled to a source select line SSL.

Although the cell string ST1 including one mode cell MC is illustrated as an example, it is to be noted that a plurality of mode cells may be included in the cell string ST1. In other words, at least one among the memory cells constructing the cell string ST1 may be set as a mode cell MC, and the remaining memory cells may be set as data cells DC.

The mode cell MC has the same structure as the data cells DC1 to DCm. However, unlike the data cells DC1 to DCm for storing the data provided from the external device, the mode cell MC may be used as a storage element for storing in which write mode the data cells of the data cell area DCA are written (or programmed).

The mode cell area MCA may be constructed by parts of the memory cells included in each of the cell strings ST1 to STn, and the data cell area DCA may be constructed by the remaining memory cells. Namely, the mode cell area MCA may be constructed by the memory cells coupled to at least one word line WL1 of the memory block BLK_B, and the data cell area DCA may be constructed by the memory cells coupled to the remaining word lines WL2 to WLm.

Figure 4:
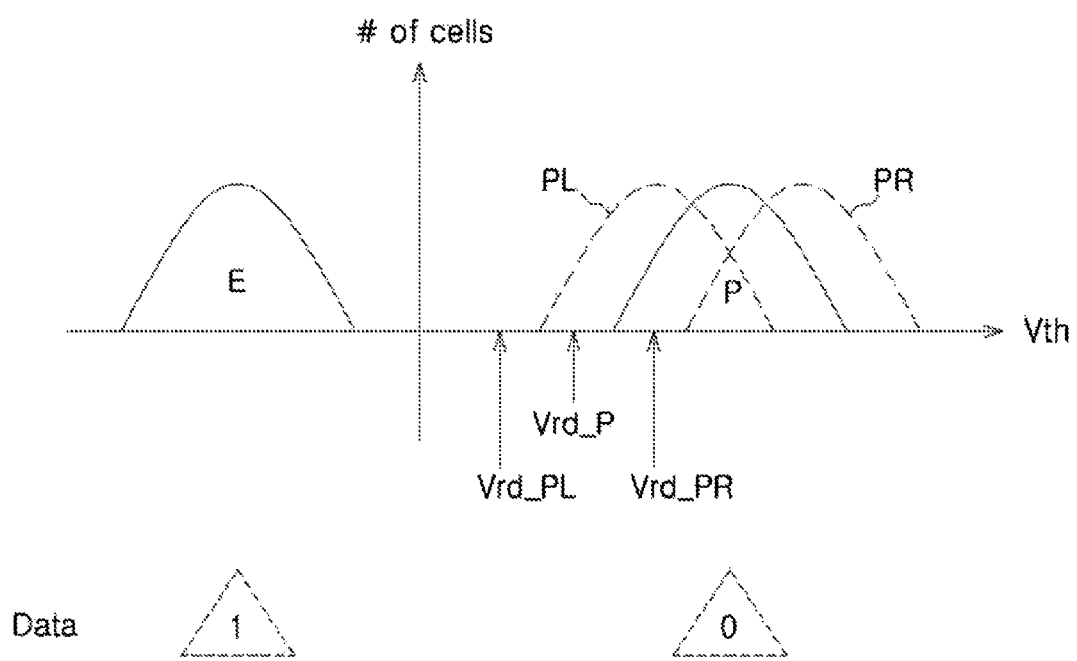
FIGS. 4 and 5 are examples of threshold voltage distribution diagrams of memory cells to assist in the explanation of a write mode and a read mode corresponding thereto.
Figure 5:
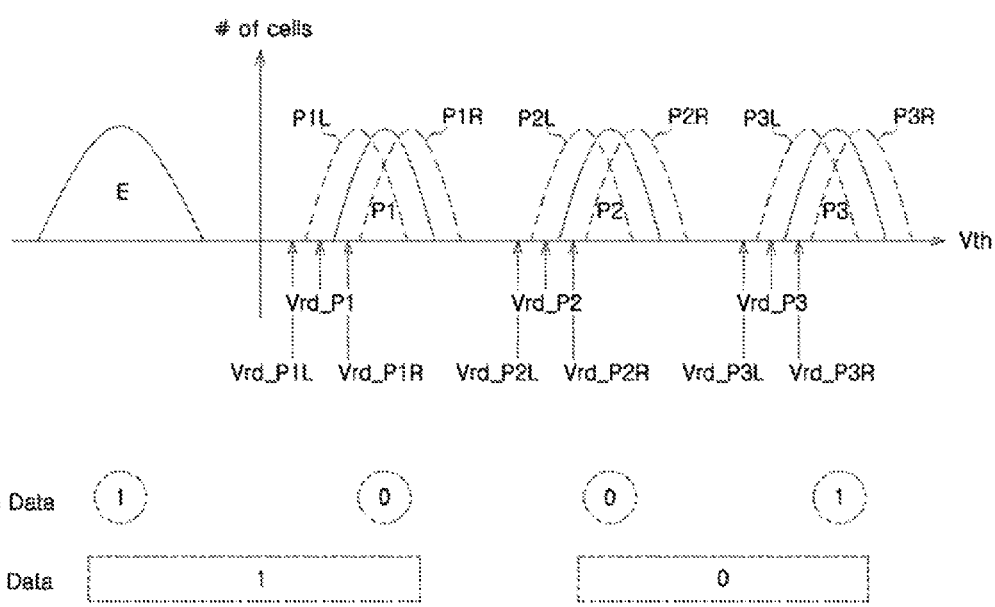

FIGS. 4 and 5 are threshold voltage distribution diagrams of memory cells to assist in the explanation of a write mode and a read mode corresponding thereto. FIG. 4 illustrates the threshold voltage distribution of single level cells (SLC) capable of storing single bit data (that is, 1 bit data) per memory cell. FIG. 5 illustrates the threshold voltage distribution of multi-level cells MLC capable of storing multi-bit data (that is, 2 or more bit data) per memory cell.

As described above, a write mode may be selected, based on various write commands or based on write mode information incident to the write commands. Memory cells may be written (or programmed) to a state corresponding to a selected write mode or may be read in a read mode corresponding to the selected write mode.

Referring to FIG. 4, for instance, when the selected write mode is a first write mode, the memory cells may be programmed to a first program state PL. When write mode information indicates the first write mode, the memory cells may be read in a first read mode corresponding to the first write mode. In this case, a read voltage Vrd_PL which has a voltage level between an erase state E and the first program state PL may be applied to the memory cells. If the read voltage Vrd_PL is applied, memory cells which have a threshold voltage of the erase state E may be determined to be on cells which store data "1", and memory cells which have a threshold voltage of the first program state PL may be determined to be off cells which store data "0".

For another instance, when the selected write mode is a second write mode, the memory cells may be programmed to a second program state P. When write mode information indicates the second write mode, the memory cells may be read in a second read mode corresponding to the second write mode. In this case, a read voltage Vrd_P which has a voltage level between the erase state E and the second program state P may be applied to the memory cells. If the read voltage Vrd_P is applied, memory cells which have a threshold voltage of the erase state E may be determined to be on cells which store data "1", and memory cells which have a threshold voltage of the second program state P may be determined to be off cells which store data "0".

For still another instance, when the selected write mode is a third write mode, the memory cells may be programmed to a third program state PR. When write mode information indicates the third write mode, the memory cells may be read in a third read mode corresponding to the third write mode. In this case, a read voltage Vrd_PR which has a voltage level between the erase state E and the third program state PR may be applied to the memory cells. If the read voltage Vrd_PR is applied, memory cells which have a threshold voltage of the erase state E may be determined to be on cells which store data "1", and memory cells which have a threshold voltage of the third program state PR may be determined to be off cells which store data "0".

The first program state PL may result as the second program state P is shifted in a direction toward a lower threshold voltage. The third program state PR may result as the second program state P is shifted in a direction toward a higher threshold voltage.

For a simplified explanation, FIG. 5 illustrates the threshold voltage distribution of multi-level cells MLC capable of storing 2 bit data per memory cell. The 2-bit multi-level cells MLC may be programmed to have a threshold voltage corresponding to any one of a plurality of program states according to multi-bit data, that is, LSB (least significant bit) data and MSB (most significant bit) data.

Referring to FIG. 5, for instance, when the selected write mode is a first write mode, the memory cells may be programmed to any one of first program states P1L, P2L and P3L. When write mode information indicates the first write mode, the memory cells may be read in a first read mode corresponding to the first write mode. In this case, any one of read voltages Vrd_P1L, Vrd_P2L, and Vrd_P3L, which have respective voltage levels between an erase state E and the first program states P1L, P2L and P3L, may be applied to the memory cells. That is, the read voltage Vrd_P1L has a voltage level between the erase state E and the first program state P1L, and the read voltage Vrd_P2L has a voltage level between the first program states P1L and P2L, and the read voltage Vrd_P3L has a voltage level between the first program states P2L and P3L. If the read voltages Vrd_P1L, Vrd_P2L and Vrd_P3L are applied, LSB data and MSB data may be determined.

For another instance, when the selected write mode is a second write mode, the memory cells may be programmed to any one of second program states P1, P2 and P3. When write mode information indicates the second write mode, the memory cells may be read in a second read mode corresponding to the second write mode. In this case, any one of read voltages Vrd_P1, Vrd_P2, and Vrd_P3, which have respective voltage levels between the erase state E and the second program states P1, P2 and P3, may be applied to the memory cells. That is, the read voltage Vrd_P1 has a voltage level between the erase state E and the second program state P1, and the read voltage Vrd_P2 has a voltage level between the second program states P1 and P2, and the read voltage Vrd_P3 has a voltage level between the second program states P2 and P3. If the read voltages Vrd_P1, Vrd_P2 and Vrd_P3 are applied, LSB data and MSB data may be determined.

For still another instance, when the selected write mode is a third write mode, the memory cells may be programmed to any one of third program states P1R, P2R and P3R. When write mode information indicates the third write mode, the memory cells may be read in a third read mode corresponding to the third write mode. In this case, any one of read voltages Vrd_P1R, Vrd_P2R, and Vrd_P3R, which have respective voltage levels between the erase state E and the third program states P1R, P2R and P3R, may be applied to the memory cells. That is, the read voltage Vrd_P1R has a voltage level between the erase state E and the second program state P1R, and the read voltage Vrd_P2R has a voltage level between the second program states P1R and P2R, and the read voltage Vrd_P3R has a voltage level between the second program states P2R and P3R. If the read voltages Vrd_P1R, Vrd_P2R and Vrd_P3R are applied, LSB data and MSB data may be determined.

The first program states P1L, P2L and P3L may result as the second program states P1, P2 and P3 are shifted in a direction toward lower threshold voltages, respectively. The third program states P1R, P2R and P3R may result as the second program states P1, P2 and P3 are shifted in a direction toward higher threshold voltages, respectively.

Figure 6:
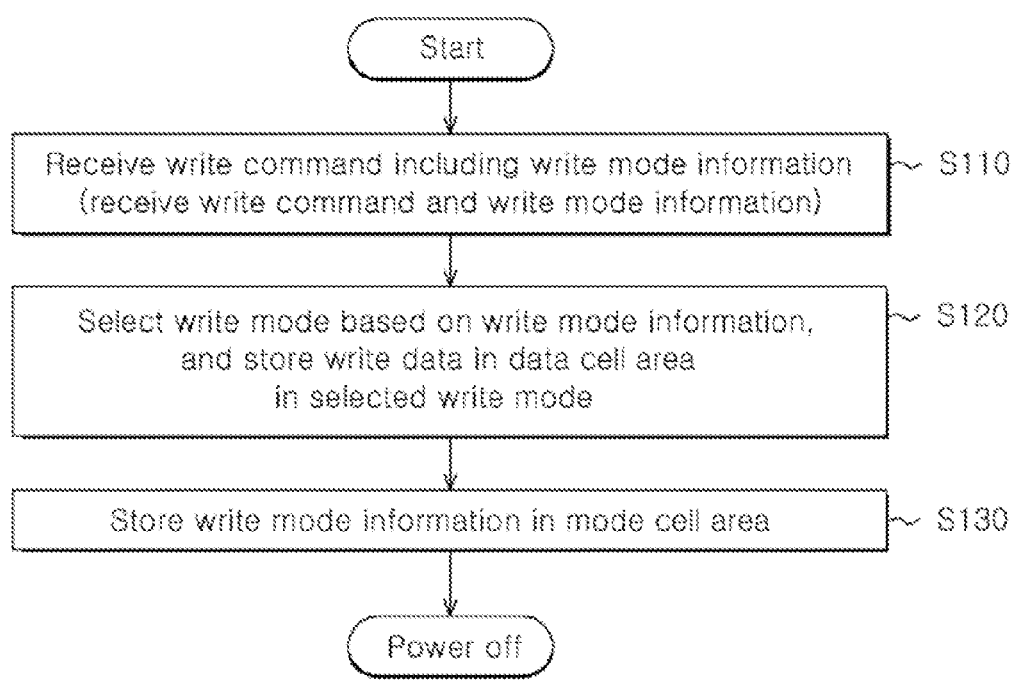
FIG. 6 is an example of a flow chart to assist in the write operation of the nonvolatile memory device in accordance with the embodiment.

FIG. 6 is a flow chart to assist in the write operation of the nonvolatile memory device in accordance with an embodiment. Hereafter, the write operation will be described with reference to FIGS. 1 and 6.

At step S110, the control logic 150 may receive a write command including write mode information (or a write command and write mode information incident to the write command) from an external device such as a memory controller. That is to say, the control logic 150 may receive any one of various kinds of write commands represented as different code values, depending on the write mode information included therein. For example, the control logic 150 may receive a first write command including first write mode information, as a first code value, or a second write command including second write mode information, as a second code value.

The first write command including the first write mode information may allow the memory cells included in the data cell area DCA of the memory cell array 110 to be programmed to a first program state (for example, the first program state PL of FIG. 4). The second write command including the second write mode information may also allow the memory cells to be programmed to a second program state (for example, the second program state P of FIG. 4) that results as the first program state is shifted in a direction toward a higher threshold voltage.

At step S120, the control logic 150 may select a write mode, based on the write mode information, and may store write data in the data cell area DCA in the selected write mode.

At step S130, the control logic 150 may store the information of the selected write mode in the mode cell area MCA of the memory cell array 110. The stored information of the write mode may be referred to in a read operation.

Figure 7:
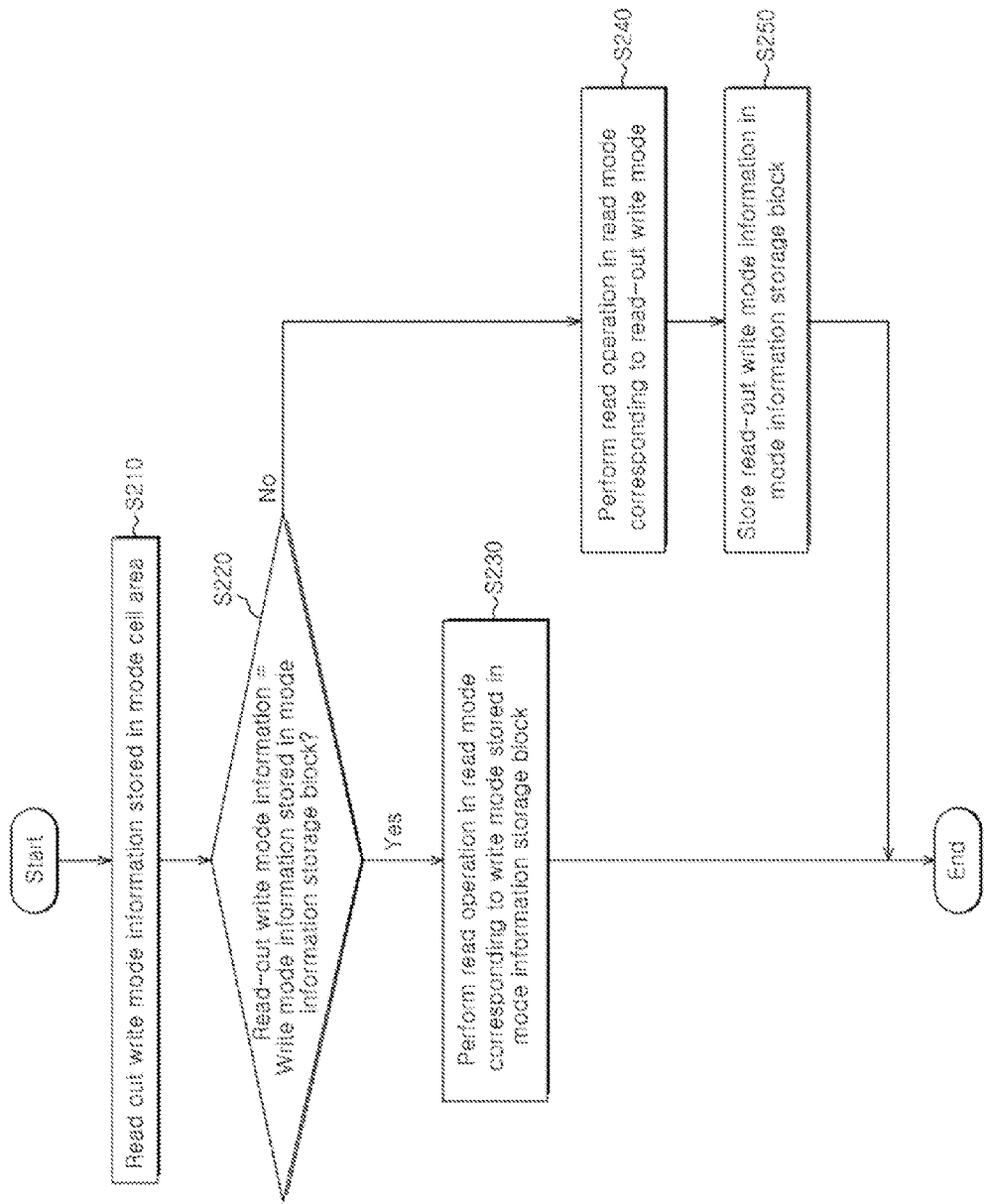
FIG. 7 is an example of a flow chart to assist in the read operation of the nonvolatile memory device in accordance with the embodiment.

FIG. 7 is a flow chart to assist in the read operation of the nonvolatile memory device in accordance with an embodiment. Hereafter, the read operation will be described with reference to FIGS. 1 and 7.

At step S210, if a read command is provided from the external device such as a memory controller, the control logic 150 may read out the write mode information stored in the mode cell area MCA.

At step S220, the control logic 150 may determine whether the read-out write mode information and the write mode information stored in the mode information storage block 160 are the same.

When the read-out write mode information and the write mode information stored in the mode information storage block 160 are the same, a read operation may be performed in the read mode previously used, without changing the read mode. In other words, at step S230, the control logic 150 may perform the read operation in the read mode corresponding to the write mode stored in the mode information storage block 160.

For example, referring to FIG. 4, when the data cell area DCA of the memory cell array 110 is programmed in the first write mode, the first read voltage Vrd_PL for determining the first program state PL may be applied to the data cell area DCA in a first read mode. For another example, when the data cell area DCA of the memory cell array 110 is programmed in the second write mode, the second read voltage Vrd_P for determining the second program state P may be applied to the data cell area DCA in a second read mode.

Conversely, when the read-out write mode information and the write mode information stored in the mode information storage block 160 are different, the previously used read mode is neglected, and a read operation may be performed in a new read mode. Namely, at step S240, the control logic 150 may perform the read operation in a read mode corresponding to the read-out write mode.

The read-out write mode information may be stored such that whether to change a read mode may be determined in a subsequent read operation. At step S250, the control logic 150 may store the read-out write mode information in the mode information storage block 160. That is to say, the control logic 150 may update the write mode information stored in the mode information storage block 160 with the read-out write mode information.

Figure 8:
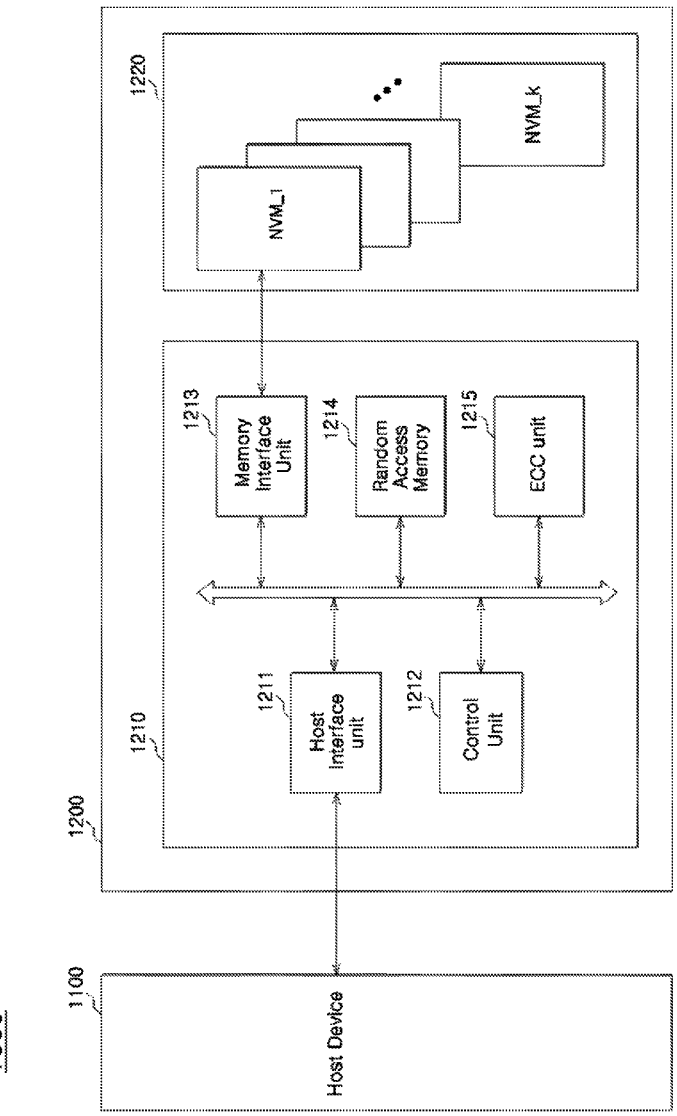
FIG. 8 is a block diagram illustrating examples of a data storage device including the nonvolatile memory device in accordance with the embodiment, and a data processing system which uses the data storage device as a storage device.

FIG. 8 is a block diagram illustrating a data storage device including the nonvolatile memory device in accordance with an embodiment, and a data processing system which uses the data storage device as a storage device.

A data processing system 1000 may include a host device 1100 and a data storage device 1200. The data storage device 1200 may include a controller 1210 and a nonvolatile memory device 1220. The data storage device 1200 may be used by being coupled to the host device 1100 such as a mobile phone, an MP3 player, a laptop computer, a desktop computer, a game player, a TV, an in-vehicle infotainment system, and so forth.

The controller 1210 may include a host interface unit 1211, a control unit 1212, a memory interface unit 1213, a random access memory 1214, and an error correction code (ECC) unit 1215.

The control unit 1212 may control the general operations of the controller 1210 in response to a request from the host device 1100. The control unit 1212 may drive firmware or software for controlling the nonvolatile memory device 1220.

The random access memory 1214 may be used as the working memory of the control unit 1212. The random access memory 1214 may be used as a data buffer memory which temporarily stores the data read from the nonvolatile memory device 1220 or the data provided from the host device 1100.

The host interface unit 1211 may interface the host device 1100 and the controller 1210. For example, the host interface unit 1211 may communicate with the host device 1100 through one of various interface protocols such as a universal serial bus (USB) protocol, a universal flash storage (UFS) protocol, a multimedia card (MMC) protocol, a peripheral component interconnection (PCI) protocol, a PCI express (PCI-E) protocol, a parallel advanced technology attachment (PATA) protocol, a serial advanced technology attachment (SATA) protocol, a small computer system interface (SCSI) protocol, and a serial attached SCSI (SAS) protocol.

The memory interface unit 1213 may interface the controller 1210 and the nonvolatile memory device 1220. The memory interface unit 1213 may provide commands and addresses to the nonvolatile memory device 1220. Furthermore, the memory interface unit 1213 may exchange data with the nonvolatile memory device 1220.

The error correction code unit 1215 may detect an error of the data read from the nonvolatile memory device 1220. Also, the error correction code unit 1215 may be configured to correct the detected error when the detected error is within a correctable range.

The nonvolatile memory device 1220 may be used as the storage medium of the data storage device 1200. The nonvolatile memory device 1220 may include a plurality of nonvolatile memory chips (or dies) NVM_1 to NVM_k, wherein k is an integer. Each of the nonvolatile memory chips NVM_1 to NVM_k which construct the nonvolatile memory device 1220 may have the same configuration as the nonvolatile memory device described above with reference to FIGS. 1 to 3, and may perform the same operations as the nonvolatile memory device described above with reference to FIGS. 4 to 7.

The controller 1210 and the nonvolatile memory device 1220 may be manufactured as any one of various data storage devices. For example, the controller 1210 and the nonvolatile memory device 1220 may be integrated into one semiconductor device and may be manufactured as any one of a multimedia card in the form of an MMC, an embedded MMC (eMMC), a Reduced-Size MMC (RS-MMC), and a micro-MMC, a secure digital (SD) card in the form of an SD, a mini-SD and an micro-SD, a universal serial bus (USB) storage device, a universal flash storage (UFS) device, a personal computer memory card international association (PCMCIA) card, a compact flash (CF) card, a smart media card, a memory stick, and so forth.

Figure 9:
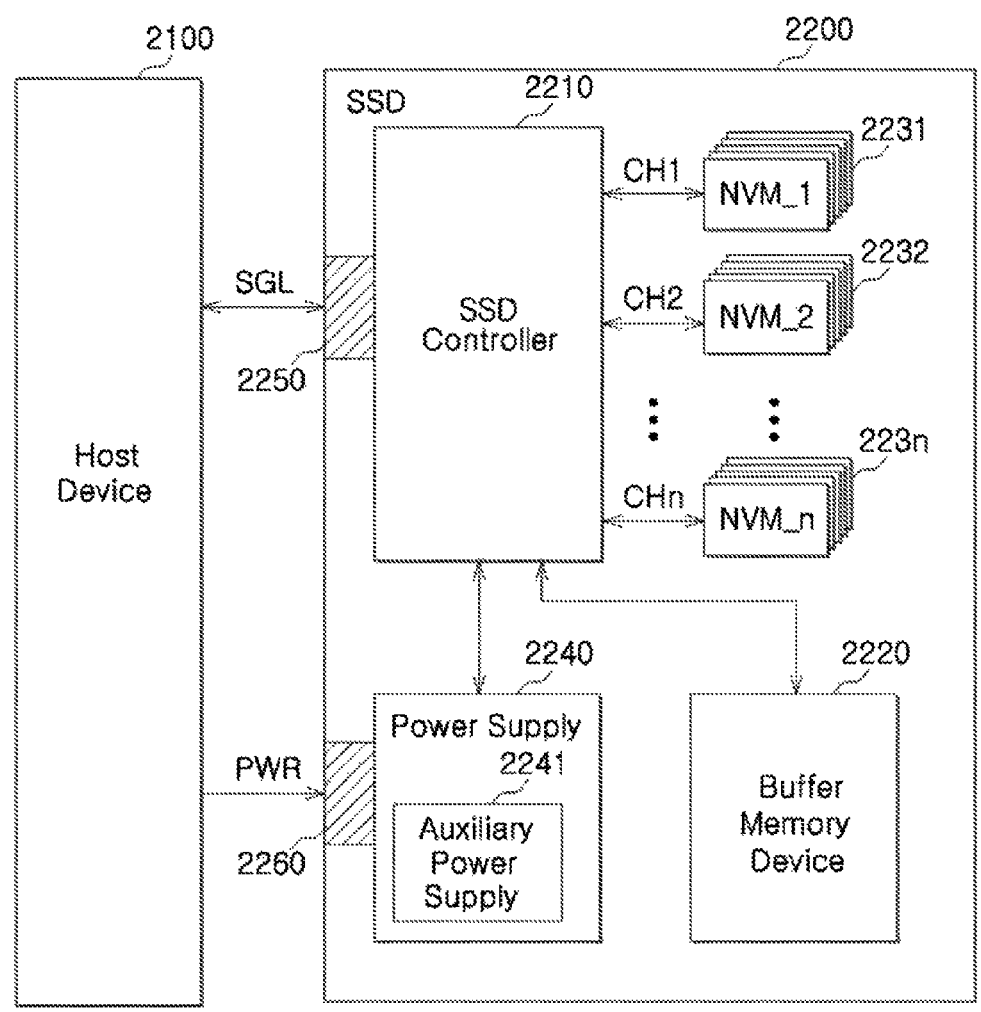
FIG. 9 is a block diagram illustrating examples of a solid state drive (SSD) including the nonvolatile memory device in accordance with the embodiment, and a data processing system which uses the solid state drive as a storage device.

FIG. 9 is a block diagram illustrating a solid state drive (SSD) including the nonvolatile memory device in accordance with an embodiment, and a data processing system which uses the solid state drive as a storage device.

A data processing system 2000 may include a host device 2100 and a solid state drive (SSD) 2200.

The SSD 2200 may include an SSD controller 2210, a buffer memory device 2220, nonvolatile memory devices 2231 to 223*n*, a power supply 2240, a signal connector 2250, and a power connector 2260.

The SSD controller 2210 may access the nonvolatile memory devices 2231 to 223*n* in response to a request from the host device 2100.

The buffer memory device 2220 may temporarily store data which are to be stored in the nonvolatile memory devices 2231 to 223*n*. Further, the buffer memory device 2220 may temporarily store data which are read from the nonvolatile memory devices 2231 to 223*n*. The data temporarily stored in the buffer memory device 2220 may be transmitted to the host device 2100 or the nonvolatile memory devices 2231 to 223*n* under the control of the SSD controller 2210.

The nonvolatile memory devices 2231 to 223*n* may be used as storage media of the SSD 2200. Each of the nonvolatile memory devices 2231 to 223*n* may have the same configuration as the nonvolatile memory device described above with reference to FIGS. 1 to 3, and may perform the same operations as the nonvolatile memory device described above with reference to FIGS. 4 to 7. The nonvolatile memory devices 2231 to 223*n* may be electrically coupled to the SSD controller 2210 through a plurality of channels CH1 to CHn, respectively. One or more nonvolatile memory devices may be electrically coupled to one channel. The nonvolatile memory devices electrically coupled to one channel may be electrically coupled to the same signal bus and data bus.

The power supply 2240 may provide power PWR inputted through the power connector 2260, to the inside of the SSD 2200. The power supply 2240 may include an auxiliary power supply 2241. The auxiliary power supply 2241 may supply power so as to allow the SSD 2200 to be properly terminated when a sudden power-off occurs. The auxiliary power supply 2241 may include super capacitors capable of being charged with the power PWR.

The SSD controller 2210 may exchange a signal SGL with the host device 2100 through the signal connector 2250. The signal SGL may include a command, an address, data, and so forth. The signal connector 2250 may be configured for various protocols such as parallel advanced technology attachment (PATA), serial advanced technology attachment (SATA), small computer system interface (SCSI), serial attached SCSI (SAS), peripheral component interconnection (PCI) and PCI express (PCI-E) protocols, depending on the interface scheme between the host device 2100 and the SSD 2200.

Figure 10:
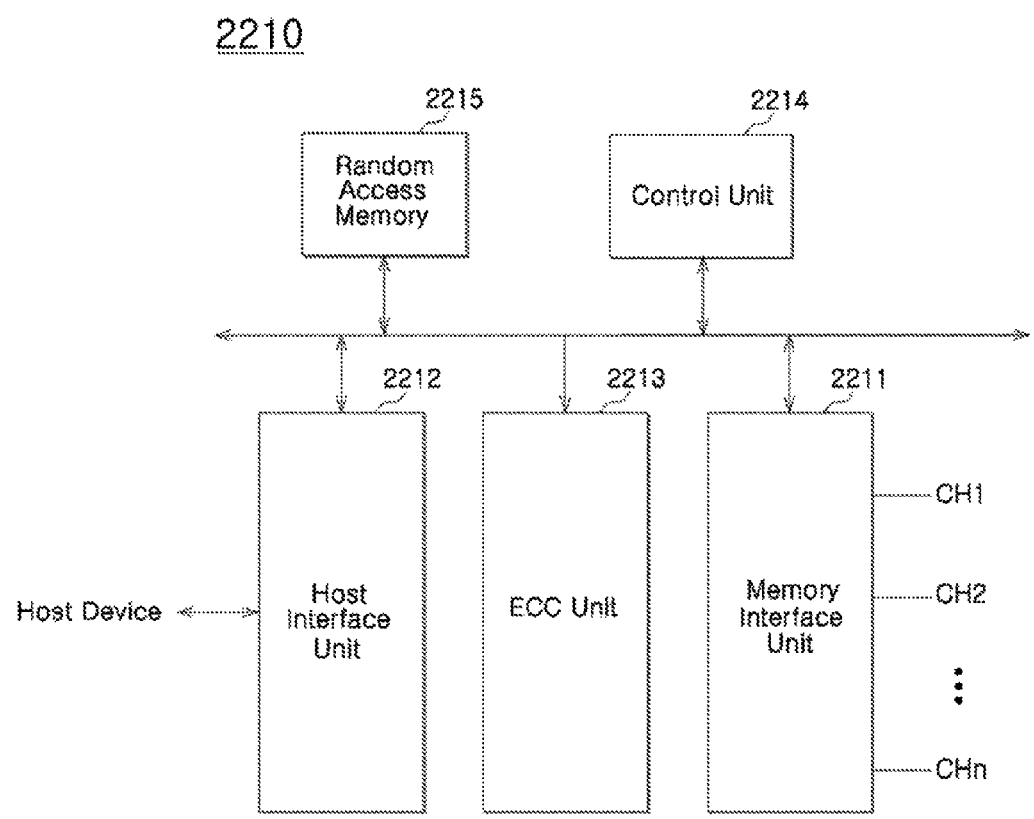
FIG. 10 is a block diagram illustrating an example of the SSD controller shown in FIG. 9.

FIG. 10 is a block diagram illustrating an example of the SSD controller shown in FIG. 9. Referring to FIG. 10, the SSD controller 2210 may include a memory interface unit 2211, a host interface unit 2212, an error correction code (ECC) unit 2213, a control unit 2214, and a random access memory 2215.

The memory interface unit 2211 may provide a control signal such as a command and an address to the nonvolatile memory devices 2231 to 223n. Moreover, the memory interface unit 2211 may exchange data with the nonvolatile memory devices 2231 to 223n. The memory interface unit 2211 may scatter the data transmitted from the buffer memory device 2220 to the channels CH1 to CHn, under the control of the control unit 2214. Furthermore, the memory interface unit 2211 may transmit the data read from the nonvolatile memory devices 2231 to 223n to the buffer memory device 2220, under the control of the control unit 2214.

The host interface unit 2212 may provide interfacing with the SSD 2200 in correspondence to the protocol of the host device 2100. For example, the host interface unit 2212 may communicate with the host device 2100 through one of parallel advanced technology attachment (PATA), serial advanced technology attachment (SATA), small computer system interface (SCSI), serial attached SCSI (SAS), peripheral component interconnection (PCI) and PCI express (PCI-E) protocols. In addition, the host interface unit 2212 may perform a disk emulating function of supporting the host device 2100 to recognize the SSD 2200 as a hard disk drive (HDD).

The ECC unit 2213 may generate parity bits based on the data transmitted to the nonvolatile memory devices 2231 to 223n. The generated parity bits may be stored along with data in the nonvolatile memory devices 2231 to 223n. The ECC unit 2213 may detect an error of the data read from the nonvolatile memory devices 2231 to 223n. When the detected error is within a correctable range, the ECC unit 2213 may correct the detected error.

The control unit 2214 may analyze and process the signal SGL inputted from the host device 2100. The control unit 2214 may control the operations of the buffer memory device 2220 and the nonvolatile memory devices 2231 to 223n based on firmware or software for driving the SSD 2200. The random access memory 2215 may be used as a working memory for driving the firmware or the software.

Figure 11:
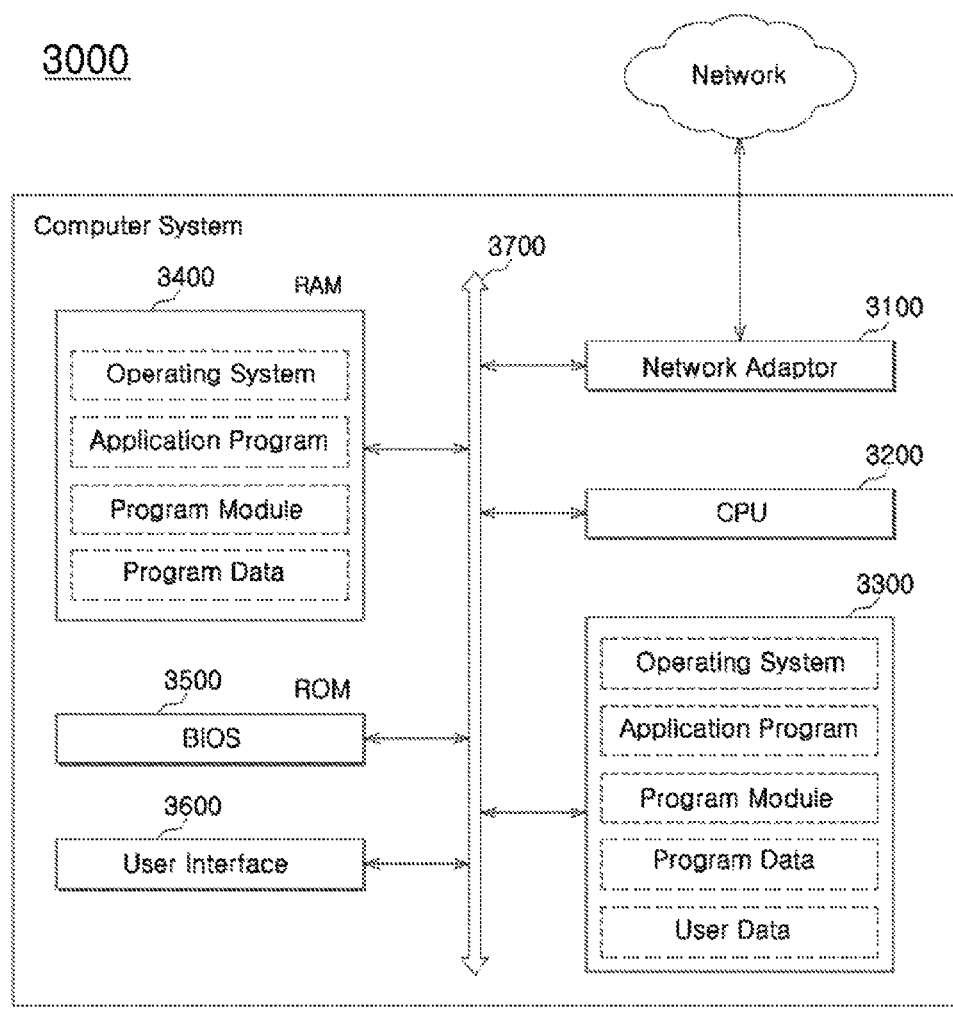
FIG. 11 is a block diagram illustrating an example of a computer system in which a data storage device is mounted, in accordance with an embodiment.

FIG. 11 is a block diagram illustrating a computer system in which a data storage device is mounted, in accordance with an embodiment. Referring to FIG. 11, a computer system 3000 includes a network adaptor 3100, a central processing unit 3200, a data storage device 3300, a random access memory (RAM) 3400, a Read-Only memory (ROM) 3500 and a user interface 3600, which are electrically coupled to a system bus 3700. The data storage device 3300 may be constructed by the data storage device 1200 shown in FIG. 8 or the SSD 2200 shown in FIG. 9.

The network adaptor 3100 may provide interfacing between the computer system 3000 and external networks. The central processing unit 3200 performs general operations for driving an operating system or an application program loaded on the RAM 3400.

The data storage device 3300 may store general data necessary in the computer system 3000. For example, an operating system for driving the computer system 3000, an application program, various program modules, program data and user data may be stored in the data storage device 3300.

The RAM 3400 may be used as the working memory of the computer system 3000. Upon booting, the operating system, the application program, the various program modules and the program data necessary for driving programs, which are read from the data storage device 3300, may be loaded on the RAM 3400. A basic input/output system (BIOS) which is activated before the operating system is driven may be stored in the ROM 3500. Information exchange between the computer system 3000 and a user may be implemented through the user interface 3600.

While various embodiments have been described above, it will be understood to those skilled in the art that the embodiments described are examples only. Accordingly, the nonvolatile memory device, the operating method thereof, and the data storage device including the same described herein should not be limited based on the described embodiments.

What is claimed is:

1. A nonvolatile memory device comprising:
   a memory cell array including a data cell area;
   a mode cell area that stores write mode information of the data cell area;
   a mode information storage block suitable for storing previous write mode information read out from the mode cell area in a previous read operation; and
   a control logic suitable for reading out the write mode information from the mode cell area, comparing the read-out write mode information and the previous write mode information, and reading the data cell area in a read mode selected based on a comparison result,
   wherein, the write mode information refers to one or more program states to which memory cells in the data cell area are programmed, the program states are corresponding to different voltage levels, and states of the data stored in the memory cells are determined at least in part by the program states.

2. The nonvolatile memory device according to claim 1, wherein the control logic reads the data cell area in a read mode corresponding to the previous write mode information, when the read-out write mode information and the previous write mode information are the same.

3. The nonvolatile memory device according to claim 1, wherein the control logic reads the data cell area in a read mode corresponding to the read-out write mode information, when the read-out write mode information and the previous write mode information are different.

4. The nonvolatile memory device according to claim 3, wherein the control logic updates the previous write mode information, with the read-out write mode information, when the read-out write mode information and the previous write mode information are different.

5. The nonvolatile memory device according to claim 1, wherein the control logic receives any write command represented as a different code value, selects a write mode of the data cell area based on the received write command, and stores data in the data cell area in the selected write mode.

6. The nonvolatile memory device according to claim 5, wherein the control logic stores the write mode information in the mode cell area based on the selected write mode.

7. The nonvolatile memory device according to claim 1, wherein the control logic selects a write mode of the data cell area based on the write mode information incident to a write command, and stores data in the data cell area in the selected write mode.

8. A data storage device comprising:
a memory controller suitable for providing a write command; and
a nonvolatile memory device including a memory cell array which includes a data cell area and a mode cell area and a mode information storage block, and suitable for selecting a write mode based on the write command provided from the memory controller, storing data in the data cell area in the selected write mode, and storing write mode information on the selected write mode in the mode cell area,
wherein, the write mode information refers to one or more program states to which memory cells in the data cell area are programmed, the program states are corresponding to different voltage levels, and states of the data stored in the memory cells are determined at least in part by the program states.

9. The data storage device according to claim 8, wherein, when a read command is provided from the memory controller, the nonvolatile memory device reads out the write mode information from the mode cell area, determines whether the read-out write mode information and previous write mode information stored in the mode information storage block are the same, and reads the data cell area in a read mode selected based on a comparison result.

10. The data storage device according to claim 9, wherein the nonvolatile memory device reads the data cell area in a read mode corresponding to the previous write mode information, when the read-out write mode information and the previous write mode information are the same.

11. The data storage device according to claim 9, wherein the nonvolatile memory device reads the data cell area in a read mode corresponding to the read-out write mode information, when the read-out write mode information and the previous write mode information are different.

12. The data storage device according to claim 11, wherein the nonvolatile memory device updates the previous write mode information with the read-out write mode information, when the read-out write mode information and the previous write mode information are different.

13. An operating method of a nonvolatile memory device, comprising:
reading out write mode information stored in a mode cell area;
determining whether the read-out write mode information and previous write mode information stored in a mode information storage block are the same; and
performing a read operation in a read mode selected based on a comparison result,
wherein, the write mode information refers to one or more program states to which memory cells in the data cell area are programmed, the program states are corresponding to different voltage levels, and states of the data stored in the memory cells are determined at least in part by the program states.

14. The operating method according to claim 13, wherein the read operation is performed in a read mode corresponding to the previous write mode information, when the read-out write mode information and the previous write mode information are the same.

15. The operating method according to claim 13, wherein the read operation is performed in a read mode corresponding to the read-out write mode information, when the read-out write mode information and the previous write mode information are different.

16. The operating method according to claim 15, further comprising:
storing the read-out write mode information in the mode information storage block, when the read-out write mode information and the previous write mode information are different.

17. The operating method according to claim 13, further comprising:
storing the write mode information in the mode cell area, based on a write mode selected by a received write command.

18. The operating method according to claim 17, wherein the received write command is a first write command including first write mode information that allows the memory cells to be programmed to a first program state, or a second write command including second write mode information that allows the memory cells to be programmed to a second program state that results as the first program state is shifted in a direction toward a higher threshold voltage.

19. The operating method according to claim 18, wherein the read mode is a first read mode, corresponding to the first write mode information, in which a first read voltage for determining the first program state is applied to the memory cells, or a second read mode, corresponding to the second write mode information, in which a second read voltage for determining the second program state is applied to the memory cells.

* * * * *